US007512919B2

United States Patent
Visweswariah

(10) Patent No.: US 7,512,919 B2
(45) Date of Patent: Mar. 31, 2009

(54) SYSTEM AND METHOD FOR INCREMENTAL STATISTICAL TIMING ANALYSIS OF DIGITAL CIRCUITS

(75) Inventor: Chandramouli Visweswariah, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 11/503,200

(22) Filed: Aug. 11, 2006

(65) Prior Publication Data
US 2006/0277513 A1 Dec. 7, 2006

Related U.S. Application Data

(62) Division of application No. 10/665,092, filed on Sep. 18, 2003, now Pat. No. 7,111,260.

(51) Int. Cl.
*G06F 17/50* (2006.01)
(52) U.S. Cl. ............................................. 716/6; 716/5
(58) Field of Classification Search .................... 716/1, 716/4–6
See application file for complete search history.

(56) References Cited

U.S. PATENT DOCUMENTS

| 5,508,937 A | 4/1996 | Abato et al. ................. 364/488 |
| 7,000,205 B2 * | 2/2006 | Devgan et al. .................. 716/6 |
| 7,086,023 B2 * | 8/2006 | Visweswariah ................. 716/6 |
| 7,111,260 B2 * | 9/2006 | Visweswariah ................. 716/6 |
| 2002/0104065 A1 * | 8/2002 | Tsukiyama et al. ............ 716/6 |

OTHER PUBLICATIONS

"Explicit Computation of Performance as a Function of Process Variation", L. Scheffer. TAU'02.Dec. 2-3, 2002. Monterey, California, USA.
"Timing Yield Estimation from Static Timing Analysis", Anne Gattiker, Sani Nassif. Rashmi Dinakar. Chris Long. IEEE International Symposium on Quality Electronic Design, 2001.
"Fast Statistical Timing Analysis by Probabilistic Event Propagation", Jing-Jia Liou. Kwang-Ting Cheng. Sandip Kundu. Angela Krstic, DAC 2001, Jun. 18-22, 2001, Las Vegas, Nevada, USA.
"Statistical Timing for Parametric Yield Prediction of Digital Integrated Circuits" J.A. G. Jess. K. Kalafala. S.R. Naidu. R.H.J.M. Otten, C. Visweswariah, DAC 2003, Jun. 2-6, 2003, Anaheim, California, USA.

* cited by examiner

*Primary Examiner*—Thuan Do
*Assistant Examiner*—Binh C Tat
(74) *Attorney, Agent, or Firm*—Keusey, Tutunjian & Bitetto, P.C.; Brian P. Verminski, Esq.

(57) ABSTRACT

The present invention is a system and method for efficiently and incrementally updating the statistical timing of a digital circuit after a change has been made in the circuit. One or more changes in the circuit is/are followed by timing queries that are answered efficiently, constituting a mode of timing that is most useful in the inner loop of an automatic computer-aided design (CAD) synthesis or optimization tool. In the statistical re-timing, the delay of each gate or wire is assumed to consist of a nominal portion, a correlated random portion that is parameterized by each of the sources of variation and an independent random portion. Correlations are taken into account. Both early mode and late mode timing are included; both combinational and sequential circuits are handled; static CMOS as well as dynamic logic families are accommodated.

1 Claim, 4 Drawing Sheets

SYSTEM AND METHOD FOR INCREMENTAL STATISTICAL TIMING ANALYSIS OF DIGITAL CIRCUITS

RELATED APPLICATION DATA

This application is a Divisional application of allowed U.S. patent application Ser. No. 10/665,092 filed on Sep. 18, 2003, now U.S. Pat. No. 7,111,260.

RELATED APPLICATIONS

C. Visweswariah, "System and Method for Statistical Timing Analysis of Digital Circuits," U.S. patent application Ser. No. 10/666,353, U.S. Patent Publication No. 2005/0065765, filed on Sep. 19, 2003. C. Visweswariah, "System and Method for Probabilistic Criticality Prediction of Digital Circuits," U.S. patent application Ser. No. 10/666,470, U.S. Patent Publication No. 2005/0066298, filed on Sep. 19, 2003.

The descriptions set forth in these co-pending applications are hereby incorporated into the present application by reference in their entirety.

FIELD OF THE INVENTION

This invention relates to design automation of digital integrated circuits. More specifically, it relates to static timing analysis of digital circuits in the presence of delay variations. Yet more specifically, the invention relates to incremental statistical timing analysis of digital circuits, which implies efficient re-analysis after a change has been made to the circuit in order to respond to specific timing queries.

BACKGROUND OF THE INVENTION

With each succeeding generation of integrated circuit technology, variability is proportionately increasing. The sources of such variability include manufacturing variations, device fatigue, environmental variations and phase-locked loop (PLL) variations. In the case of manufacturing variations, the front-end-of-the-line (FEOL) which are the layers that define the active transistors show variation in the transistor's electrical characteristics. Physical quantities such as the length of the gate, depth of the semiconductor junction or thickness of the oxide cannot be perfectly controlled during manufacturing and hence show variations, which lead to variations in the behavior of the transistors. As the physical dimensions get smaller in modern technologies, variability is proportionately increasing. In addition, the back-end-of-the-line (BEOL), which consists of the metal interconnect layers, also exhibits variability. For example, the thickness, width and inter-layer dielectric thickness of each metal layer are sources of variability. These in turn cause the wires to change their delay, and in fact these sources of variability can change the delay of gates which are driving them and gates which are driven by them.

The second main type of variations is due to device fatigue effects such as hot electron and negative bias temperature instability (NBTI). After a long period of use in the field, transistor characteristics change due to these physical phenomena, leading to changes in the delay of circuit components.

The third main type of variations is due to environmental effects such as temperature and power supply voltage.

The fourth main type of variations is PLL variations which can include PLL jitter and duty-cycle variability.

It is to be noted that in addition to the above, there are other sources of variation such as model-to-hardware miscorrelation, silicon-on-insulator (SOI) history effects and coupling noise. These other types of variation can also be considered during statistical timing analysis of digital integrated circuits.

The variation of delays shown by gates and wires in an integrated circuit can be classified in many different ways. The variation may be from batch-to-batch during the manufacturing, wafer-to-wafer, chip-to-chip or within a single chip. Lens aberration effects during photolithography, for example, can cause variation of the effective length of transistors across a reticle field. There can be temperature and power supply voltage variations across a chip. The variations can also be classified by the time scales during which variability develops. For instance, fatigue effects cause variability over a period of years, whereas across the chip temperature or power supply gradients can develop over seconds or milliseconds, and coupling noise variations can occur in nanoseconds or picoseconds. Whichever way they are classified, it is abundantly clear that these sources of variation are making integrated circuit analysis and design more difficult and must be accurately accounted for during timing analysis.

The traditional timing methodology to handle such variability is to conduct multiple static timing analysis at different "cases" or "corners" to determine the spread of performance of the circuit under these variations. Corners may include, for example, "best case," "nominal" and "worst case." Unfortunately, the traditional methodology is breaking down because the number of independent and significant sources of variation is numerous, and too many timing runs would be required. One way to combat this is to worst-case or guardband against some sources of variation, but this causes pessimism in the performance prediction. Another way to combat the explosion of timing runs required is to skip the analysis at certain corners, but this is risky since the performance of the circuit may be unacceptable at the skipped corners and this may be manifested by chips failing on the tester or in the field. Because of these effects, uiaditional timing methodologies are rapidly becoming burdensome, as well as risky and pessimistic at the same time.

A solution to the problems faced by traditional timing methodologies is statistical or probabilistic timing analysis. In such an analysis, timing quantities such as delays, arrival times and slacks are not treated as single numbers, but rather as probability distributions. Thus the full probability distribution of the performance of the circuit under the influence of variations is predicted by a single timing run. The problems of unnecessary risk, excessive timing runs and pessimism are all potentially avoided. Four examples of such statistical timing methods in the prior art include Liou et al [J-J. Liou, K-T. Cheng, S. Kundu and A. Krstic, "Fast statistical timing analysis by probabilistic event propagation," Proc. Design Automation Conference, June 2001, Las Vegas, Nev., pages 661-666], Scheffer [L. Scheffer, "Explicit computation of performance as a function of process variation," Proc. ACM/IEEE workshop on timing issues in the specification and synthesis of digital systems, December 2002, Monterey, Calif., pages 1-8], Gattiker et al [A. Gattiker, S. Nassif, R. Dinakar and C. Long, "Timing yield estimation from static timing analysis," Proc. IEEE International Symposium on Quality Electronic Design (ISQED), 2001, pages 437-442] and Jess et al [J. A. G. Jess, K. Kalafala, S. R. Naidu, R. H. J. M. Otten and C. Visweswariah, "Statistical timing for parametric yield prediction of digital integrated circuits," Proc. Design Automation Conference, June 2003, Anaheim, Calif., pages 932-937]. The references cited above are herein incorporated by reference in their entirety.

PROBLEMS WITH THE PRIOR ART

There are several reasons why prior-art methods are not suitable in practice. The main shortcoming of prior-art methods is their failure to correctly account for correlations. The delays of gates and wires on an integrated circuit exhibit strong correlation. Consider a simple example to demonstrate the importance of correlations. A chip that has 50,000 latches has 50,000 setup timing tests and 50,000 hold timing tests. Assume that the probability of each of these tests being successfully met is 99.99%. If the 100,000 probabilities are perfectly correlated, then the overall probability of the chip working correctly is 99.99%. That is, if one test passes, they will all pass. However, if the probabilities are independent, then the probability of making a working chip is 0.9999 raised to the $100,000^{th}$ power, which is a paltry yield of 0.005%!

There are many sources of delay correlation, and some examples are described below. Two paths may share some of the same gates; in this case, the delays of the two paths are correlated. If a particular chip has stronger P-type transistors due to some manufacturing variations, chances are that every single P-type transistor on that chip will be stronger. If the 3rd level of metal is a little thicker, it is likely to be thicker across the entire chip. A launching path (path that gets the data signal to a latch) and a capturing path (path that gets the corresponding clock signal to the same latch) may exhibit some commonality and therefore have correlated delays. The commonality could include sharing some gates along the path, sharing metal layers, sharing a power supply voltage island, sharing gates of the same type, etc. Delays of gates may also be correlated because of their physical position on the surface of a chip. For example, two gates that are close to each other are unlikely to see significant relative channel length variation and their delays are therefore likely to be tightly correlated.

All of these sources of variation must be accurately taken into account, or else the results will not be meaningful. In Liou et al, the delay of each individual gate is considered to be completely independent of any other gate, rendering the analysis unusable in practice. In Gattiker et al, gate delay correlations are considered. Critical paths are enumerated, but when the effects of these paths are combined, the delay of each path is considered to be independent of any other, thus ignoring several important sources of correlation.

Among the prior art methods, one that takes into account correlation is Jess et al. This method is a path-based method. The delay or slack of each path is collected and represented as a first-order model of the sources of variation. Then the slack of the overall circuit or chip is computed by combining these path slacks in a correlated probabilistic fashion. Unfortunately, there are an exponential number of paths in any circuit. It is not realistic to list and analyze all the paths in the circuit. Jess et al suggest that the top N critical paths be considered, but of course there is no guarantee that the $(N+1)^{st}$ path (or any path other than the first N paths) will not be critical at some point or corner in the process space or space of variations. All path-based methods have the fundamental limitation that the number of paths is too large and some heuristic must be used to limit the number of paths submitted for detailed analysis.

It is to be noted that although there are many significant sources of correlation in the delay variability of integrated circuits, there are some completely random sources of variation as well. For example, the oxide thickness in transistors in a modern technology is only a few atoms thick and for various reasons it is possible for transistors to have one more or one less layer of atoms, leading to variations that are quite random from transistor-to-transistor. While the prior-art method of Liou et al can handle such random variations, other prior-art methods such as those of Gattiker et al and Jess et al cannot.

Further, all of the above prior-art methods have a number of other shortcomings. Automated optimization methods of digital integrated circuits such as logic synthesis and physical synthesis methods use an incremental static timer in their inner loop. The synthesis techniques employ many different trial-and-error methods to optimize the circuit, and they repeatedly use the incremental timer to gauge the impact of each of the proposed circuit changes. The efficiency of the timer in incremental mode is crucial to the success of the synthesis methods, since they query the timer potentially millions of times. None of the prior-art statistical timing methods is incremental in its analysis.

For these and other reasons, statistical timing methods that have been proposed in the literature are not used in industrial practice.

ASPECTS OF THE INVENTION

An aspect of this invention is a system and method to efficiently conduct incremental statistical timing analysis of digital circuits.

Another aspect of this invention is a method to efficiently update the statistical timing of a digital circuit after one or more change(s) has/have been made to the circuit.

Another aspect of this invention is to use tightness probabilities to minimize the computation required to perform incremental statistical timing analysis of a digital circuit.

Another aspect of this invention is a method efficiently to answer statistical timing queries about a digital circuit after one or more change(s) has/have been made to the circuit.

Another aspect of this invention is a method for incremental statistical timing that takes into account correlations between delays of individual gates and wires, and correlations between delays of paths of the circuit.

Another aspect of this invention is a method for incremental statistical timing that allows delay models that contain a deterministic part, a correlated random part and an independent random part.

SUMMARY OF THE INVENTION

The present invention is a system and method for efficiently and incrementally updating the statistical timing of a digital circuit after a change has been made in the circuit. One or more changes in the circuit is/are followed by timing queries that are answered efficiently, constituting a mode of timing that is most useful in the inner loop of an automatic computer-aided design (CAD) synthesis or optimization tool. In the statistical re-timing, the delay of each gate or wire is assumed to consist of a nominal portion, a correlated random portion that is parameterized by each of the sources of variation and an independent random portion. Correlations are taken into account. Both early mode and late mode timing are included; both combinational and sequential circuits are handled; static CMOS as well as dynamic logic families are accommodated.

BRIEF DESCRIPTION OF THE FIGURES

The foregoing and other objects, aspects, and advantages will be better understood from the following non-limiting detailed description of preferred embodiments of the invention with reference to the drawings that include the following.

DETAILED DESCRIPTION OF THE INVENTION

Figure 1:
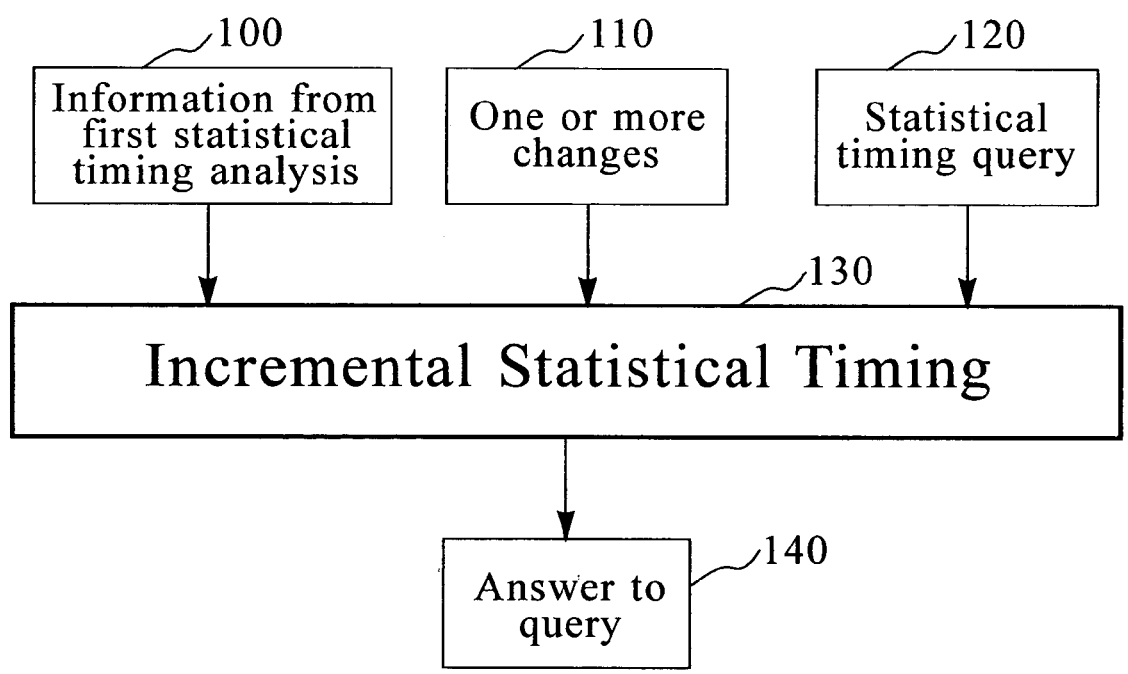
FIG. 1 is a block diagram of one preferred embodiment of the invention depicting incremental statistical timing analysis of a digital circuit.

An inventive incremental statistical timing flow is shown in FIG. 1. Incremental timing pre-supposes that an initial (or first) statistical timing of an electrical circuit has already been conducted. Statistical timing implies timing of the circuit in the presence of statistical fluctuations of delays. The delay variations are modeled as functions of global sources of variation as well as random (independent) sources of variation. The information from the previous statistical timing (including all inputs and outputs of the first statistical timing analysis), box 100, is an input to the incremental statistical timing. See C. Visweswariah, "System and Method for Probabilistic Criticality Prediction of Digital Circuits," Ser. No. 10/666,470, referenced above and incorporated by reference.

One purpose of incremental statistical timing is to respond to timing queries after one or more changes is/are made to the electrical circuit being timed or the conditions under which the electrical circuit was timed. To be efficient, retiming the entire circuit is avoided, hence the term "incremental." So the second input to incremental statistical timing is one or more changes, box 110, which may be addition of a gate, re-sizing of a gate, addition of a latch, removal of a latch, addition of a wire, removal of a wire, buffering of a wire, etc. Box 120 shows the third input to the system, which is one or more statistical timing queries. Timing queries can include a request for a statistical slack at a timing point, a statistical arrival time or required arrival time at a timing point, a statistical slew (rise/fall time) at a timing point and a request to list the most critical path or paths. The query may request the mean, variance, full distribution or certain confidence level of each of these statistical values. The query may also request the sensitivity of the statistical value to one or more global sources of variation, or ask for the random part of the statistical quantity. Queries are usually, but not always, specific to a certain node or portion of the electrical circuit. Incremental statistical timing is performed (box 130) to produce an answer to the query or queries (box 140). Typically, a calling program exploits incremental statistical timing analysis to automatically optimize or improve the electrical circuit, hence the incremental timer is often invoked a large number of times. Thus it is important for the incremental timer to be efficient and calculate as little information as possible to answer the query. The calling program often tries many combinations of alternatives in a trial-and-error attempt to improve the circuit; thus, after a query, the change or changes most recently applied are often undone. It is therefore all the more important to do as little work as possible in answering the query since many changes ultimately get undone. Thus incremental timing uses the concept of "lazy evaluation" to re-compute as little information as possible in response to a query, while carefully keeping track of which pieces of most-recently-computed timing information are valid and which are not.

Figure 2:
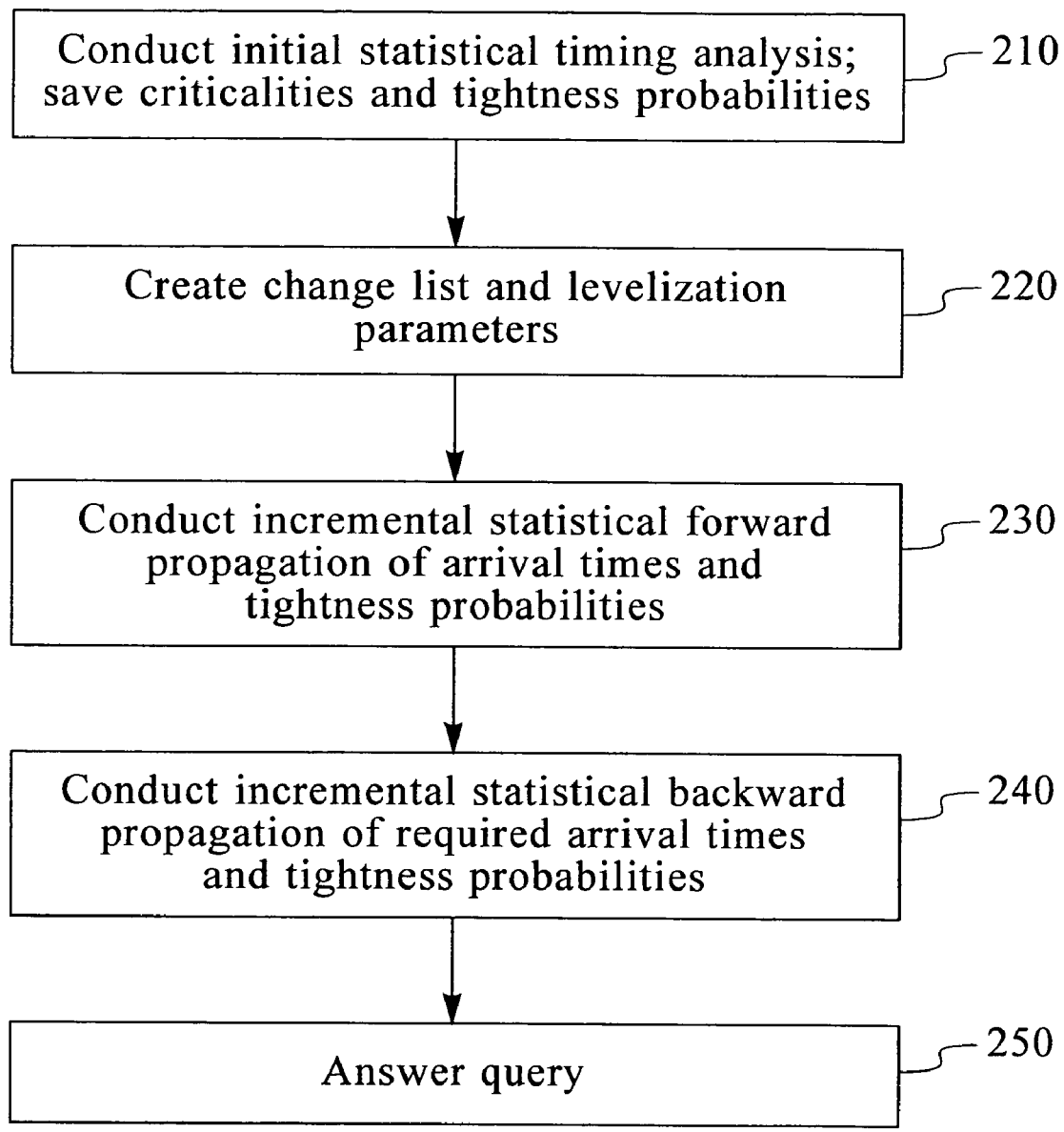
FIG. 2 is a flow chart of the preferred method of conducting incremental statistical timing analysis.

The details of the inventive incremental statistical timing are shown in flow 200 of FIG. 2. In box 210, the initial statistical timing analysis is performed, preferably, but not necessarily, by the method of the co-pending application Ser. No. 10/666,353, C. Visweswariah, "System and Method for Statistical Timing Analysis of Digital Circuits,", referenced above and incorporated herein by reference. Any statistical timing method that determines arrival and required arrival tightness probabilities will be suitable. The arrival and required arrival tightness probabilities are saved on each edge of the timing graph during the initial statistical timing analysis. Criticality probabilities can also be determined during the initial statistical timing analysis, preferably, but not necessarily, by the method of C. Visweswariah, "System and Method for Probabilistic Criticality Prediction of Digital Circuits," Ser. No. 10/666,470.

Next, in box 220, the changes since the last timing query are collated into a change list and levelization parameters are assigned to each gate. Levelization of timing graphs is well known. These levelization parameters include AT (arrival time) levels, RAT (required arrival time) levels and AT-RAT levels (the highest level number on which each RAT depends), which are determined, in a preferred way, as taught in R. P. Abato, A. D. Drumm, D. J. Hathaway and L. P. P. P. van Ginneken, "Incremental static timing analysis," U.S. Pat. No. 5,508,937, issued April 1993, which is herein incorporated by reference in its entirety.

Next, in box 230, arrival times and arrival tightness probabilities are incrementally and statistically propagated forwards. In box 240, required arrival times and required arrival tightness probabilities are incrementally and statistically propagated backwards. The details of the propagation will be explained later.

Finally, in box 250, an answer is provided to the timing query or queries based on the computation in boxes 230 and 240.

Figure 3:
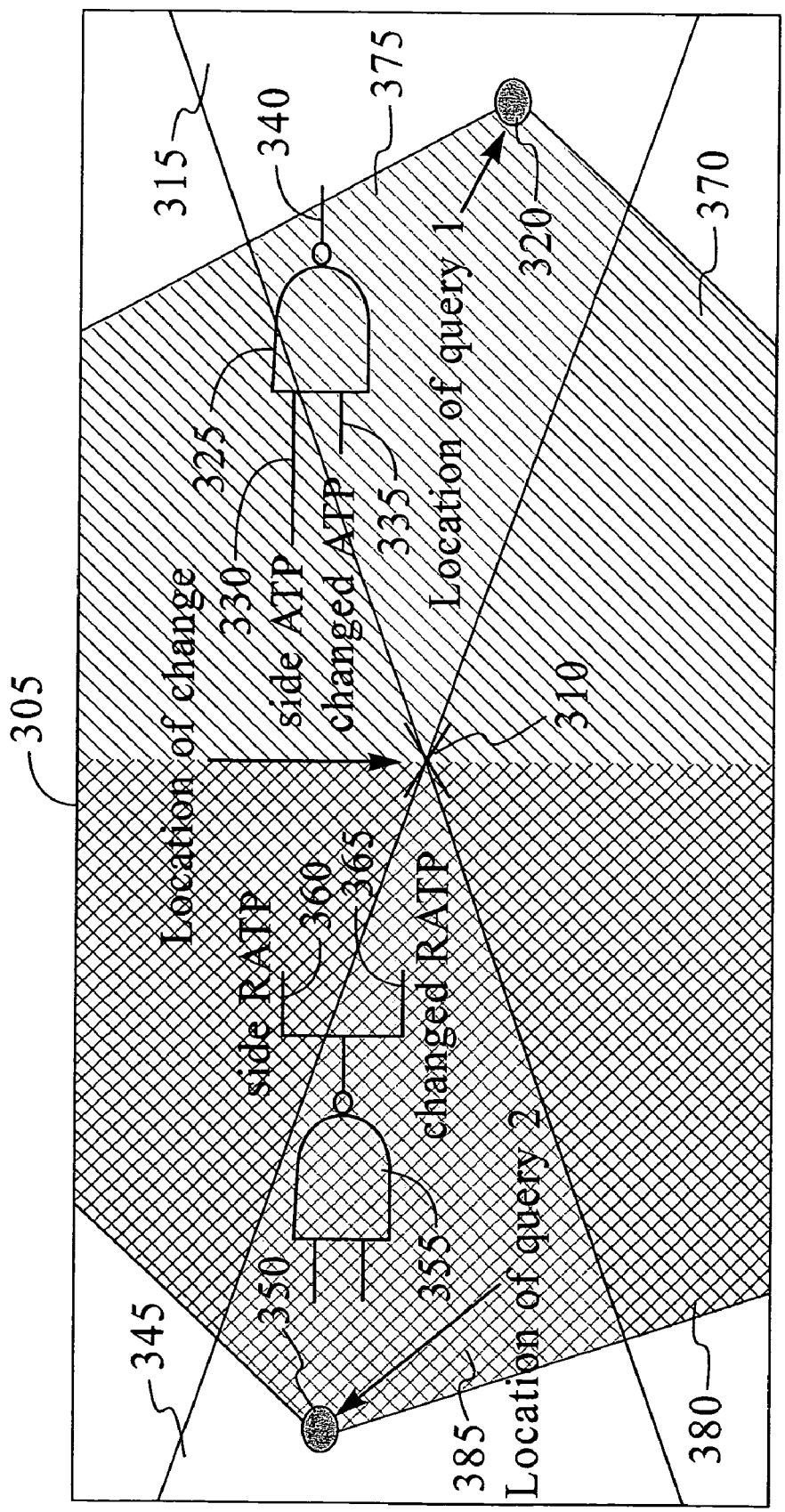
FIG. 3 illustrates an example of incremental statistical timing analysis.

The inventive forward and backward propagation are explained in detail in reference to FIG. 3. Incremental timing in the deterministic timing domain was taught in R. P. Abato, A. D. Drumm, D. J. Hathaway and L. P. P. P. van Ginneken, "Incremental static timing analysis," U.S. Pat. No. 5,508,937, issued April 1993. There are two preferred prior-art techniques for limiting the amount of re-computation required during incremental timing analysis: level-limiting and dominance-limiting. Referring to FIG. 3, box 305 is the circuit or chip that is being analyzed. An initial timing of the circuit is conducted. Then a change is made to the circuit at a location labeled 310 in FIG. 3. (The location 310 can be an edge or a node in the circuit.) This change results in a change of arrival times and slews (rise/fall times) only in the shaded fanout cone of logic marked 315. (The fanout cone of logic includes only those edges and nodes of the electrical circuit that are at some point in any path fed by the node/edge 310.)

The system can query any node to determine the node's arrival time (AT) and/or required arrival time (RAT) and/or slew. A slack query implies both an AT and a RAT query. If there is an AT query at location/node 320, then only nodes/edges within the fanin cone of location/node 320 can change the AT or slew of query point 320. This fanin cone is shown as 370 in FIG. 3.

Therefore, to answer the query, only the ATs and slews that are both in the fanout cone of 310 and the fanin cone of 320 need be updated. Thus, the arrival times and slews are propagated only in that portion of the timing graph that is in the intersection of the fanout cone of 310 (marked 315 in FIG. 3) and the fanin cone of node 320 (marked 370 in FIG. 3). This intersection 375 is called the re-computation portion of the graph. Re-computing arrival times and slews only in this limited portion of the graph is called level-limiting. During this forward propagation of arrival times and slews, at each node that has fanin edges from both the re-computation portion and the unchanged portion (i.e., a side input), if the side arrival time dominates both before and after the change, the change need not be propagated any further. In the case of gate 325, if input 330 determines the arrival time of output 340 both before and after the change, forward propagation through gate 325 can be halted. Stated differently, if the arrival time of output 340 is not changed due to the circuit change, forward propagation through gate 325 can be halted. This is called dominance-limiting. In this manner, forward propagation is limited.

Similarly, if there is a required arrival time (RAT) query at location 350, then the RATs in the shaded cone of logic labeled 345 must be re-computed because they are directly affected by the circuit change at location 310. In fact, the entire fanin cone of all nodes in 315 is affected due to slew propagation effects. These effects are handled by assigning to each node of the timing graph an AT-RAT level, which is the highest level number on which each RAT depends. Thus, ATs are only propagated till the AT-RAT level of the query point and no further, and then RATs are propagated backwards in the intersection 385 of the fanin cone of any point with an AT or slew change and the fanout cone 380 of the RAT query point, which is called the re-computation portion of the graph. Consider a gate 355 with one fanout in the re-computation portion and another that is not. In this case, if the side fanout 360 determines the RAT at the output of gate 355 both before and after the circuit change, then RATs need not be propagated backwards any further through gate 355, which is another case of dominance-limiting. Stated differently, if the RAT at the output of gate 355 is unchanged due to the change in the circuit, RATs need not be propagated backwards any further through gate 355. In this manner, AT queries and RAT queries are efficiently handled in an incremental fashion. Different slew propagation mechanisms are used to limit the amount of re-computation required to answer RAT queries. These techniques are known from the prior art and apply to deterministic static timing analysis.

In this invention, the incremental timing techniques discussed above are extended to the statistical timing domain, which is explained here again in reference to FIG. 3. All of the teachings of Abato et al apply directly, especially the level-limiting techniques. The inventive technique is the probabilistic version of dominance-limiting. The inventive dominance-limiting procedure is applicable both during forward AT propagation as well as backward RAT propagation. First consider forward AT propagation. In the case of gate 325 in FIG. 3, if the arrival tightness probability of the edge from 335 to 340 was previously very small and continues to be very small after the circuit change, dominance-limiting is employed to halt the forward propagation through gate 325. The arrival tightness probability provides a convenient measure to estimate the impact of each input in determining the arrival time of the output of a gate. Thus, a tolerance can be set on the smallness of arrival tightness probability both before and after the change to implement dominance-limiting in a quantitative manner in the context of the inventive statistical timing method. Similarly, during backward RAT propagation, consider the case of gate 355. If the required arrival tightness probability of the edge of the graph from 365 to the output of gate 355 was sufficiently small both before and after the circuit change, then required arrival times and required arrival time probabilities need be propagated no further to the inputs of gate 355 and their fanin cones. Thus, tightness probabilities allow a quantitative measure for dominance-limiting during incremental static timing analysis.

Figure 4:
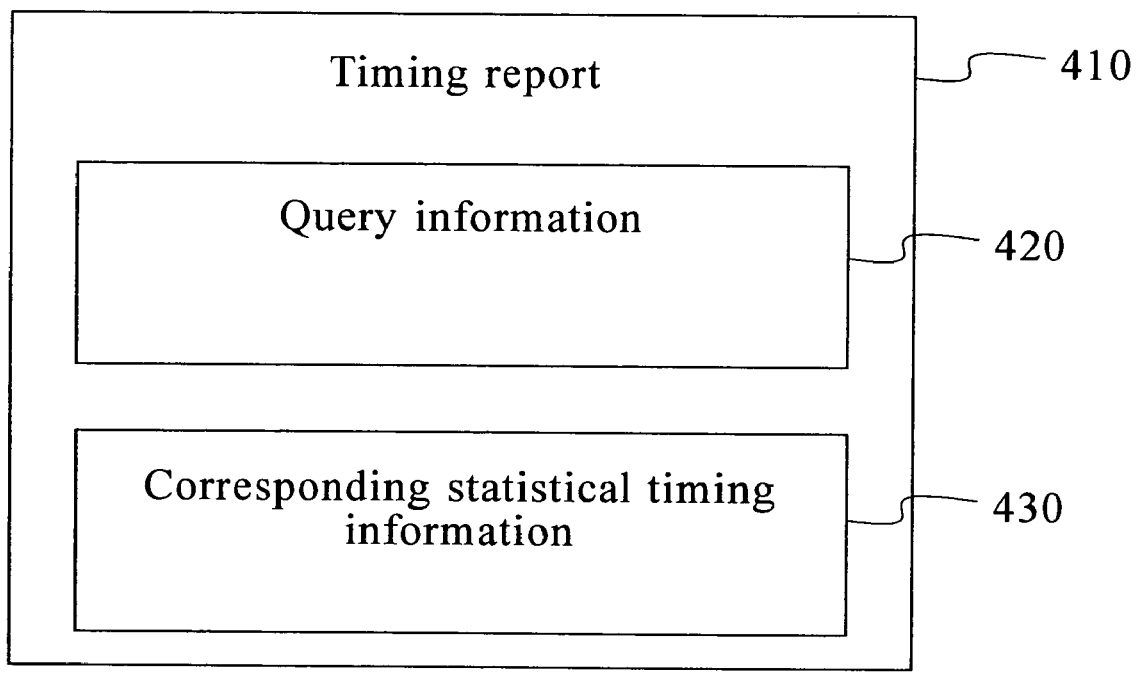
FIG. 4 is a block diagram of one preferred embodiment of an output report.

Once the efficient incremental timing analysis has been completed, all that is left is to answer the query made by the user or the calling program. Answering the query is called "producing a timing report" herein, although the answer to a specific query is usually briefer and contains less information than a conventional timing report. Timing reports are illustrated in box 410 of FIG. 4. Timing reports are communicated to the user preferably by means of a programming interface, but also possibly by means of a hard disk file or files. A timing report typically consists of some query information (box 420) and the corresponding statistical timing information (box 430) which is the response to the query. The circuit information is for the user or calling program to identify which query is being answered. It can be as simple as a query number or other "handle" such as a pointer to a query data structure object. Or it can include one or more gates, edges, nodes, paths, sequential elements, timing tests or clock phases about which the query was made. The report then includes the corresponding statistical timing response to that query. The corresponding statistical timing information, in the case of a node, could include one or more of the node's statistical arrival time, statistical required arrival time, statistical slew, statistical slack or criticality probability. For a timing test or primary output, the corresponding timing information could include the probability that the timing test is met, or the primary output meets its required arrival time, respectively. For a path, the corresponding timing information could include the statistical path slack and statistical arrival time, required arrival time, slew and slack of its end point, and the criticality probability of the path. Further, each statistical timing quantity in the report can be represented in various forms, including a mean value and standard deviation; a mean value, independent random part and a correlated part; a graphical display of the distribution of the timing quantity; or sensitivities to individual global sources of variation. Further, given any two statistical timing quantities, the report could include the correlation coefficient of the two quantities, the covariance matrix of the two quantities, and the probability that one is larger or smaller than the other. It is to be understood that each of the timing quantities in the above description can be one of an early-mode or late-mode timing quantity; one of a rising or falling timing quantity; and a timing quantity that is specific to a particular phase of a particular clock. The criticality probabilities can be the arrival and required arrival tightness probabilities of an edge of the timing graph. The criticality probabilities could also be the criticality probability of a node or edge of the timing graph; these probabilities can be global or on a per-end-point basis. It is to be further understood that once the incremental statistical timing analysis is completed, these results can be reported in a variety of useful ways.

While the above description of incremental timing was explained with an example of a single change to the circuit before a query was made, it is to be understood that one of ordinary skill in the art will be able to extend the methods to a situation where there are multiple changes between queries. In this respect, the teachings of Abato et al apply in exactly the same fashion for the statistical domain as they do for the deterministic timing domain.

It is to be understood that the detailed description of this invention was explained in the context of a simple combinational circuit. One of ordinary skill in the art will be able to extend these concepts to accommodate separate rising and falling arrival times and delays; sequential circuits; circuits with transparent latches; extensions to handle slew (rise/fall time) propagation and effects; circuits with probabilistic guard times on the latch setup and hold tests; circuits with probabilistic guard times on dynamic circuit timing tests; circuits with multiple clock phases; and cases in which clock cycle periods and timing assertions are probabilistic.

Given this disclosure it is apparent to one skilled in the art that the inputs received by the "Incremental statistical timing process" (box 130 of FIG. 1) can be any input generally known to computer systems, including but not limited to: keyboard or mouse entries, disk, tape, CD-ROM, network connection, fiber optic connection, radio frequency link, infra red link, etc. Further the outputs "Answer to query" (box 140 of FIG. 1) can take the form of any known computer output. These outputs include but are not limited to: printed output from a printer, images on a graphical user interface (GUI) or CRT, content on storage media (e.g., memory, CD-ROM, disk, diskette), files, information transmitted over a network (fiber optic, telephone, cable, radio frequency, infrared, etc.).

I claim:

1. A system for incremental statistical timing analysis of an electrical circuit comprising:
   a. a results input for receiving one or more results of a first statistical timing analysis where the first statistical timing analysis propagates timing values as a weighted sum of probability distributions of one or more of sources of variation;
   b. a change input for receiving one or more incremental changes to the electrical circuit;
   c. a query input for receiving one or more statistical timing queries that request updated statistical timing information about the electrical circuit where the query is one or more of: a statistical arrival time at a node, a statistical required arrival time at a node, a statistical slack at a node, a statistical slew at a node, an arrival tightness probability of an edge, a required arrival tightness probability of an edge, a criticality probability of an edge, a criticality probability of a node, and a probability of a timing test being met; and
   d. an incremental statistical timing process that provides the one or more answers to the respective queries as an output of the system, the incremental statistical timing process including a timing graph representing timing features of the electrical circuit, the timing graph including a recomputation portion corresponding to the one or more incremental changes to the electrical circuit, the recomputation portion including an intersection between a fanin cone and a fanout cone corresponding to each incremenental change where the recomputation portion is determined through forward and backward propagation timing analyses to limit a number of recomputations needed to answer queries, the one or more answers being the requested statistical timing information for the electrical circuit with the incremental changes.

\* \* \* \* \*